(12) United States Patent
Krueger et al.

(10) Patent No.: US 7,816,656 B2
(45) Date of Patent: Oct. 19, 2010

(54) METHOD OF IMPLANTING ION SPECIES INTO MICROSTRUCTURE PRODUCTS BY CONCURRENTLY CLEANING THE IMPLANTER

(75) Inventors: Christian Krueger, Liegau-Augustusbad (DE); Rastislav Kocis, Radebeul (DE); Marek Braun, Dresden (DE); Niels-Wieland Hauptmann, Moritzburg (DE); Heinz Seidel, Zeithain (DE)

(73) Assignee: Advanced Micro Devices, Inc., Austin, TX (US)

( * ) Notice: Subject to any disclaimer, the term of this patent is extended or adjusted under 35 U.S.C. 154(b) by 69 days.

(21) Appl. No.: 12/256,128

(22) Filed: Oct. 22, 2008

(65) Prior Publication Data

US 2009/0221136 A1    Sep. 3, 2009

(30) Foreign Application Priority Data

Feb. 29, 2008 (GB) .................... 10 2008 011 929.6

(51) Int. Cl.
*H01J 37/317* (2006.01)
*H01J 37/08* (2006.01)
*H01J 49/10* (2006.01)

(52) U.S. Cl. .............................. 250/492.21; 250/492.2; 250/423 R

(58) Field of Classification Search ............ 250/492.21, 250/492.2, 423 R; 315/111.81
See application file for complete search history.

(56) References Cited

U.S. PATENT DOCUMENTS

| 7,137,354 | B2 * | 11/2006 | Collins et al. .......... 118/723 IR |
| 7,586,109 | B2 * | 9/2009 | Perel et al. ............. 250/492.21 |
| 2002/0000523 | A1 | 1/2002 | Ng et al. ................. 250/492.21 |
| 2006/0093754 | A1 * | 5/2006 | Krueger et al. .............. 427/523 |

OTHER PUBLICATIONS

Translation of Official Communication from German Patent Office for German Patent Application No. 10 2008 011 929.6-43 dated Nov. 18, 2008.

* cited by examiner

*Primary Examiner*—Nikita Wells
(74) *Attorney, Agent, or Firm*—Williams, Morgan & Amerson

(57) ABSTRACT

By operating an implantation tool with a source gas having a halogen fraction of 66 atomic percent or less relative to the total composition of the source gas, an in situ cleaning effect may be achieved while performing an implantation process.

21 Claims, 4 Drawing Sheets

METHOD OF IMPLANTING ION SPECIES INTO MICROSTRUCTURE PRODUCTS BY CONCURRENTLY CLEANING THE IMPLANTER

BACKGROUND

1. Field of the Disclosure

The present disclosure generally relates to the fabrication of microstructures, such as integrated circuits, and, more particularly, to implanting ion species by means of ion implantation tools required for producing well-defined doped regions in specified material regions and/or treating specific device regions.

2. Description of the Related Art

The fabrication of complex microstructures, such as sophisticated integrated circuits, requires that a large number of individual process steps be performed to finally obtain the required functionality of the microstructure. Especially during the fabrication of integrated circuits, the conductivity of specific areas has to be adapted to design requirements and also, frequently, the state of materials in specified device regions may have to be modified, at least temporarily, for instance with respect to crystalline structure and the like. For instance, the conductivity of a semiconductor region may be adapted, for example, increased in a well-defined manner, by introducing specific impurities, which are also referred to as dopants, and placing some or preferably most of these impurities at lattice sites of the semiconductor crystal. In this way, so-called PN junctions may be formed that are essential for obtaining a transistor function, since transistors represent the active elements, i.e., elements providing current or voltage amplification, which are required for manufacturing electronic circuits. In other cases, the modification of the crystalline state or the adaptation of the material characteristics, for instance in view of etch behavior, internal stress levels of materials and the like, may be required, permanently or temporarily, in order to enhance device performance and/or provide a more efficient process flow. For example, at some stages of the manufacturing flow of complex integrated devices, a substantially amorphous state of a portion of drain and source regions may be advantageous for a variety of reasons.

In modern integrated circuits, millions of transistor elements, such as field effect transistors, are typically provided on a single die, wherein, in turn, a plurality of dies are provided on a single substrate. As the critical dimensions of certain circuit elements, such as field effect transistors, have now reached 0.05 μm and even less, it is of great importance to correspondingly "fine-tune" the profile of doped regions in the lateral direction, with respect to a substrate, as well as in the depth direction. In this respect, ion implantation has been proven to be a viable technique for introducing a great variety of species into materials of microstructure devices and therefore ion implantation is currently the preferred method of introducing dopants into specified device regions, due to the ability to precisely control the number of implanted dopant atoms into substrates with a repeatability and uniformity of better than ±1%. Moreover, impurities that are introduced by ion implantation have a significantly lower lateral distribution when compared to conventional diffusion dopant processes. Since ion implantation is typically a room temperature process, the lateral profiling of a doped or otherwise implanted region may, in many cases, be conveniently achieved by providing a correspondingly patterned photoresist mask layer. These characteristics may render ion implantation, currently and in the near future, the preferred technique to produce doped regions in a semiconductor device and also make ion implantation an attractive technique for appropriately modifying material characteristics in view of effects, such as local strain relaxation, local amorphization of initially crystalline regions, locally adapting etch rates and the like.

Implantation of desired species is accomplished by ion implantation tools, which represent extremely complex machines requiring continuous monitoring of the machine characteristics and the machine status to achieve high efficiency and machine utilization. In particular, maintenance activities may have to be performed on a regular basis in order to re-condition the state of certain components of the implanter tools that suffer from increased wear during the operation of the implanter, as will be described in more detail with reference to FIG. 1.

FIG. 1 illustrates a schematic view of an ion implantation tool 100 comprising an ion source 101 having an input 102 that is connected to respective precursor source gases (not shown), such as boron fluoride ($BF_3$), phosphorous hydride ($PH_3$), arsenic hydride ($AsH_3$), carbon fluoride ($CF_4$) and the like, from which an appropriate ion species may be created in the ion source 101. The ion source 101 may be configured to establish a plasma atmosphere and to pre-accelerate charged particles into a beam pipe schematically depicted as 103. Downstream of the ion source 101, an accelerator tube 104 is arranged that is dimensioned to accelerate ions with a specified voltage, which may typically range from zero to approximately 200 keV for a typical medium current implanter and may range to several hundred keVs or even to 1 MeV or more in high-energy implanters. Downstream from the accelerator tube 104, a beam shaping element 105, such as a quadruple magnet, may be arranged, followed by a deflector magnet 106. Downstream of the deflector magnet 106 is disposed an analyzing aperture, for instance in the form of a slit 107, the dimensions of which substantially determine an energy spread of the ion beam. Thereafter, a further beam shaping element, such as a quadruple magnet 108, may be provided downstream of the analyzing slit 107.

Furthermore, a substrate holder 109 is located in the vicinity of the end of the beam line 103, wherein, typically, the substrate holder 109 may be provided in the form of a plate enabling the receipt of one or more substrates 110. The plate 109 is typically connected to a drive assembly (not shown) that enables movement of the substrate holder 109 in the transverse direction (as indicated by the arrows depicted in FIG. 1) and also allows control of the tilt angle, at least in two planes, at which the ion beam hits the substrate 110. For convenience, corresponding well-established means for controlling and adjusting the tilt angle are not shown. Moreover, a first ion beam detector 111 may be provided, for instance, embodied by a plurality of Faraday cups that are connected with respective current measurement devices. Furthermore, a second ion beam detector 112 may be provided as a so-called traveling Faraday cup that is laterally movable to determine the shape of an ion beam and/or to shade respective Faraday cups during the measurement of specific beam characteristics, such as the angle of incidence.

During the operation of the ion implantation tool 100, an appropriate precursor gas is supplied by the inlet 102 to the ion source 101, in which an arc discharge may be established to produce a plasma ambient for generating ions of atoms included in the precursor gases. Thus, an appropriate voltage may have to be applied to the gas ambient to ignite and maintain a plasma, thereby producing accelerated particles, which may also come into contact with the chamber walls and other internal components, such as tungsten wires and the like. The ions within the ion source may be accelerated into the beam line 103 by means of a pre-accelerator means. Typically, a plurality of ions having different charge states may be supplied by the ion source 101 during the creation of a plasma ambient and may thus be introduced into the acceleration tube 104. Typically, a preselection of the type of ions and of the respective charge states may be accomplished within the ion source 101 by a corresponding deflector magnet (not shown). Thereafter, the ions pass the accelerator tube 104 and gain speed in accordance with the applied acceleration voltage, the charge states of the respective ion and its corresponding mass. Hence, the acceleration tube 104 comprises electrodes for applying the required high voltage at defined positions of the tube 104, wherein insulators provide electric insulation of the electrodes in order to suppress high voltage breakthroughs, which may result in beam instabilities and the like. By means of the quadruple magnet 105, the ion beam may be focused in one dimension and may be correspondingly defocused in the perpendicular dimension and the correspondingly shaped beam is directed to the deflector magnet 106. The current generating the magnetic field of the deflector magnet 106 is controlled so as to deflect the trajectory of desired ion species having a desired charge state to the opening of the analyzing slit 107. Ions of differing mass and/or charge state will typically hit the analyzer 107 without passing through the slit. Thus, the ions in the beam passing the analyzer 107 have a well-defined mass and an energy distribution defined by the slit size.

It should be noted that, in some ion implantation tools, the deflecting magnet 106 and the analyzer 107 are configured such that the ion beam passing through the analyzer 107 may be scanned in a transverse direction so as to cover the whole area of a substrate or at least a significant portion thereof, since the dimension of the beam shape, i.e., the size of the beam spot, is usually, depending on the energy of the ion beam, significantly less than the area of a substrate to be processed. Next, the beam passing through the analyzer 107 may be further shaped by the quadruple magnet 108 so that, in combination with the quadruple magnet 105, a desired beam shape may be obtained that finally impinges on the substrate 110 to cause the desired effect, such as positioning a dopant at a desired depth and with a desired concentration and the like.

During the implantation processes, however, the ionization of the source gas in the chamber 101 may result in an increased interaction with chamber walls and other components, as previously discussed, thereby increasingly sputtering off material from these components, which may therefore also be ionized and accelerated into the beam line 104 and to any component downstream from the beam line 104. These materials may "condensate" on specific components of the implantation tool 100, wherein, in particular, the sputtering off of conductive materials, such as tungsten, may result in the deposition of this conductive material at sensitive areas, such as insulating materials, which may thus increasingly accumulate and reduce the insulating capabilities thereof, finally resulting in additional high voltage discharges between neighboring high voltage regions, thereby contributing to significant beam instabilities. Moreover, because of the increasing accumulation of unwanted materials, such as tungsten and the like, modification of the beam characteristics may be observed, even prior to actually causing additional breakdown events between adjacent high voltage components, thereby also contributing to process non-uniformity. For these reasons, cleaning processes for conditioning the implantation tool 100 have to be performed on a regular basis, which may be accomplished by generating argon or xenon ion beams during respective cleaning periods of the implantation tool.

For example, implantation processes performed during the manufacturing of semiconductor devices that are performed on the basis of boron fluoride ($BF_3$) as a source material, or boron ions, boron fluoride ions, or fluorine ions, as well as implantation processes performed on the basis of carbon fluoride as a source material for creating carbon ions, carbon fluoride ions and fluoride ions, are well known to cause a pronounced sputtering effect in the ion source 101, which may thus result in a subsequent enhanced condensation of these materials along relevant portions of the beam line 105. Also, other implantation processes, for instance using phosphorous hydride ($PH_3$) and arsenic hydride ($AsH_3$), which may be used for introducing dopant species for forming drain and source areas, may also result in an accumulation of material after several hours of operating the implantation tool 100.

Consequently, preventive maintenance activities may be necessary on a regular basis to recondition the beam line to provide enhanced process uniformity during the operation of the implantation tool for processing actual products. However, the required conditioning of the beam line may result in reduced throughput and thus increased production cost, as typically a higher number of implantation tools may have to be provided in a semiconductor facility for a given desired overall output.

The present disclosure is directed to various methods that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the present disclosure relates to methods for operating an implantation tool and/or forming microstructure devices using implantation tools, wherein throughput of implantation tools may be increased by efficiently conditioning or cleaning portions of the implantation tool on the basis of a specified amount of halogen species provided in the source gas, wherein, in some illustrative aspects disclosed herein, the conditioning of the implantation tool may be performed concurrently with the processing of product substrates. Without intending to restrict the contents of the present disclosure to the following explanation, it is believed that the amount of fluorine or in general the amount of a halogen species in the source gas may have a significant influence on the degree of material condensation in the beam line. That is, if the fraction of the halogen species of the source gas is above a certain level, which is typically the case in conventionally used source gases including halogens, such as boron fluoride ($BF_3$), the transport mechanism with respect to species sputtered off from the process chamber may result in a significant accumulation in sensitive tool areas. On the other hand, a fraction of halogen species below the specified threshold may significantly reduce the probability of actually depositing unwanted species, such as tungsten, on exposed beam line components. Thus, by providing an additional gas component, which may be appropriate for "diluting" the fraction of halogen species in conventionally used source gases with increased halogen contents, the probability of accumulating unwanted material may be significantly reduced, or the accumulation may even be inverted, so that, during an implantation process, at least a significantly reduced amount of unwanted material may condensate on beam components or a cleaning effect may even be achieved. Thus, any unproductive operating time periods of the implantation tool may be significantly reduced compared to conventional strategies, wherein actual implantation cycles for processing products may be employed as conditioning or cleaning periods of the implantation tool under consideration, thereby providing an "in situ cleaning" mode.

One illustrative method disclosed herein relates to the formation of microstructure products. The method comprises creating ions from a source gas in a plasma ambient, wherein the source gas comprises a halogen species and wherein an operating ratio of the halogen species to non-halogen species of the source gas is 2:1 or less. The method further comprises accelerating the ions into a beam line and implanting at least a fraction of the ions into a material formed above a substrate that comprises the microstructure product in an intermediate manufacturing stage.

A further illustrative method disclosed herein relates to the conditioning of an implantation tool, wherein the method comprises providing a source gas having a ratio of halogen species to non-halogen species that is 2:1 or less. The method further comprises operating the implantation tool using the source gas.

A still further illustrative method disclosed herein relates to the processing of substrates, which comprise microstructure products. The method comprises determining a cleaning status of an implantation tool used for performing at least one implantation process of a manufacturing flow for manufacturing the microstructure devices. Additionally, the method comprises processing at least some substrates in the implantation tool on the basis of a source gas including a halogen for conditioning the implantation tool, at least when the cleaning status indicates that a cleaning of the implantation tool is required.

BRIEF DESCRIPTION OF THE DRAWINGS

The disclosure may be understood by reference to the following description taken in conjunction with the accompanying drawings, in which like reference numerals identify like elements, and in which.

Figure 1:
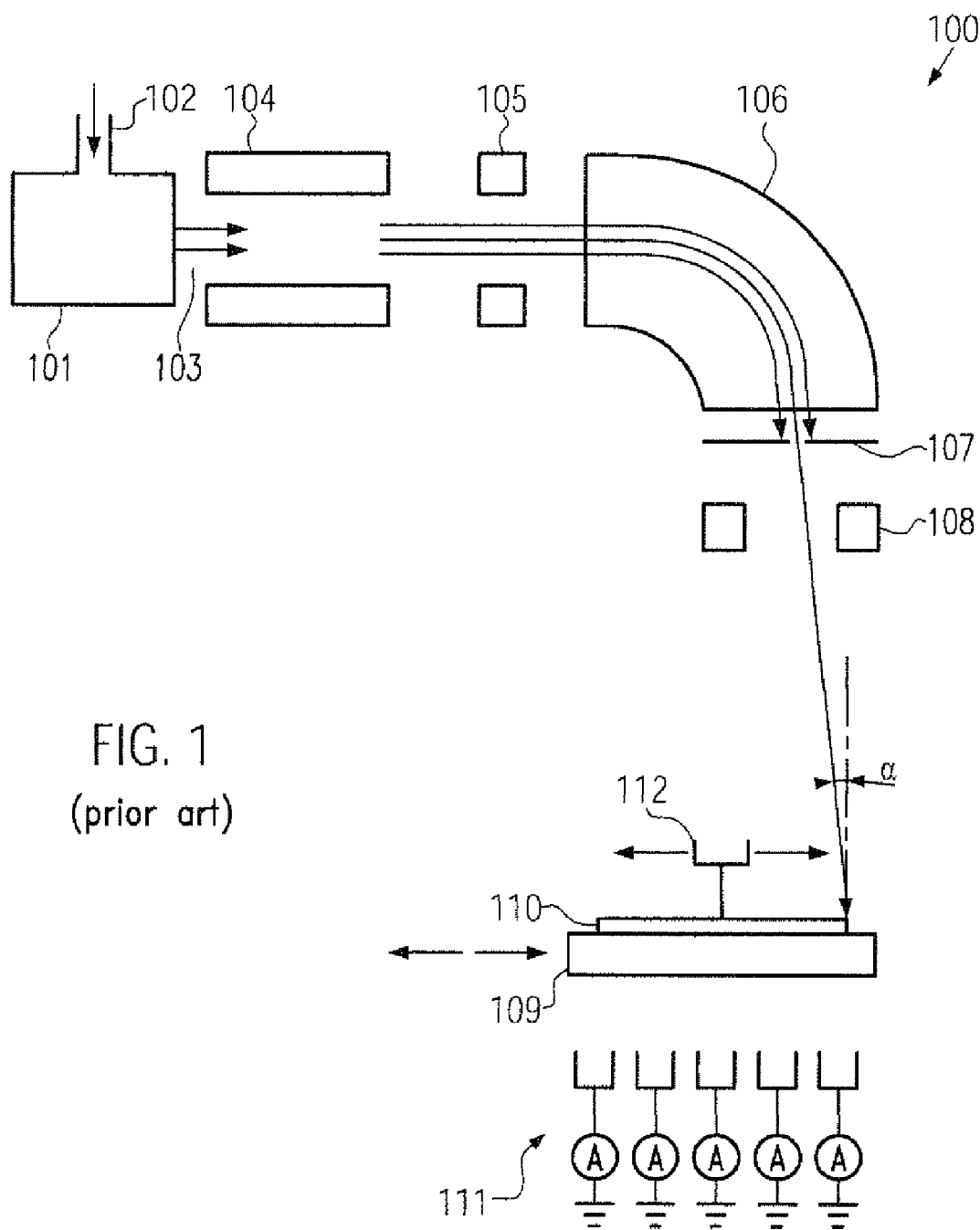
FIG. 1 schematically illustrates an ion implantation tool as may be used for performing implantation processes during the manufacturing sequence of microstructure products, such as semiconductor devices, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides methods for forming microstructure devices, such as semiconductor devices, and/or operating implantation tools used during a corresponding manufacturing flow, wherein enhanced tool throughput and thus reduced production costs may be achieved by reducing the time intervals for conditioning the implantation tool. For this purpose, the composition of the source gas used for generating the ionic species for the implantation process may be appropriately controlled in view of its halogen species fraction to achieve a conditioning or cleaning effect during the operation of the implantation tool on the basis of the controlled halogen fraction. As explained above, a strong dependence of the halogen fraction in the source gas on the "sputter and condensation" mechanism during an implantation process is believed to exist, wherein a significant change or even a substantially inverse behavior with respect to condensation of unwanted material in the beam line may be observed below and above a specific threshold. For example, observations seem to indicate that the tungsten transport mechanism in the plasma ambient and the subsequent accelerator of an ion source of an implantation tool may significantly depend on, for instance, the presence of a fluorine species, wherein a ratio of fluorine to other non-halogen species of greater than approximately 2:1 may result in significant unwanted condensation of tungsten material within the beam line.

For example, as previously described, a significant condensation of material may be observed during the usage of boron fluoride ($BF_3$), which may be a frequently used source gas, for instance for introducing a P-type dopant into semiconductor devices. On the other hand, reducing the fraction of fluorine to 2:1 or less, which may, for instance, be accomplished by adding an appropriate gas, such as argon, carbon dioxide, carbon monoxide, oxygen, xenon and the like, not only the degree of tungsten condensation in the beam line may be reduced but a removal of deposited material may also be observed, thereby obtaining a desired conditioning or cleaning effect. Consequently, by appropriately "diluting" halogen species containing source gases to exhibit a ratio of 2:1 or less with respect to halogen to non-halogen species, or by establishing a halogen fraction of approximately 66 atomic percent with respect to the total composition of the source gas, the implantation tool may be operated to process actual products, while additionally obtaining a desired cleaning or conditioning effect or at least significantly reducing the degree of contamination of beam line components. Similarly, operating the implantation tool on the basis of a source gas that does not include a halogen species, the corresponding gas component including a halogen species may be added, thereby also providing the desired cleaning or conditioning effect during an actual implantation process, thereby also contributing to enhanced tool throughput, since maintenance activities may be reduced.

Consequently, according to the principles disclosed herein, implantation tools may be efficiently conditioned or cleaned on the basis of an appropriately selected fraction of halogen species in the source gas, which, in illustrative embodiments, may be accomplished during the processing of actual products. In some illustrative embodiments, the implantation tool may be operated substantially on a permanent basis by using an appropriate halogen fraction in the source gases, while, in other illustrative embodiments, respective implantation recipes may be invoked on demand or the manufacturing flow for the processing of substrates may be appropriately scheduled to process substrates on the basis of an appropriate implantation recipe when a desired conditioning of the tool may be required. For example, efficient implantation recipes may be used for a plurality of processes, for instance, for the substantial amorphization of substantially crystalline semiconductor regions, for strain relaxation and the like, wherein the halogen contents of the source gas is controlled to have a desired cleaning effect, for instance when using xenon fluoride, wherein the xenon species may be used as an appropriate heavy inert implantation species. Thus, when detecting the requirement for a conditioning of the implantation tool, or on a regular basis, the scheduling of the overall process flow within a manufacturing environment may be controlled such that products requiring a xenon-based implantation process may be processed with high priority, thereby also providing an efficient cleaning and conditioning effect without interrupting the overall process flow at the implantation tool.

Figure 2A:
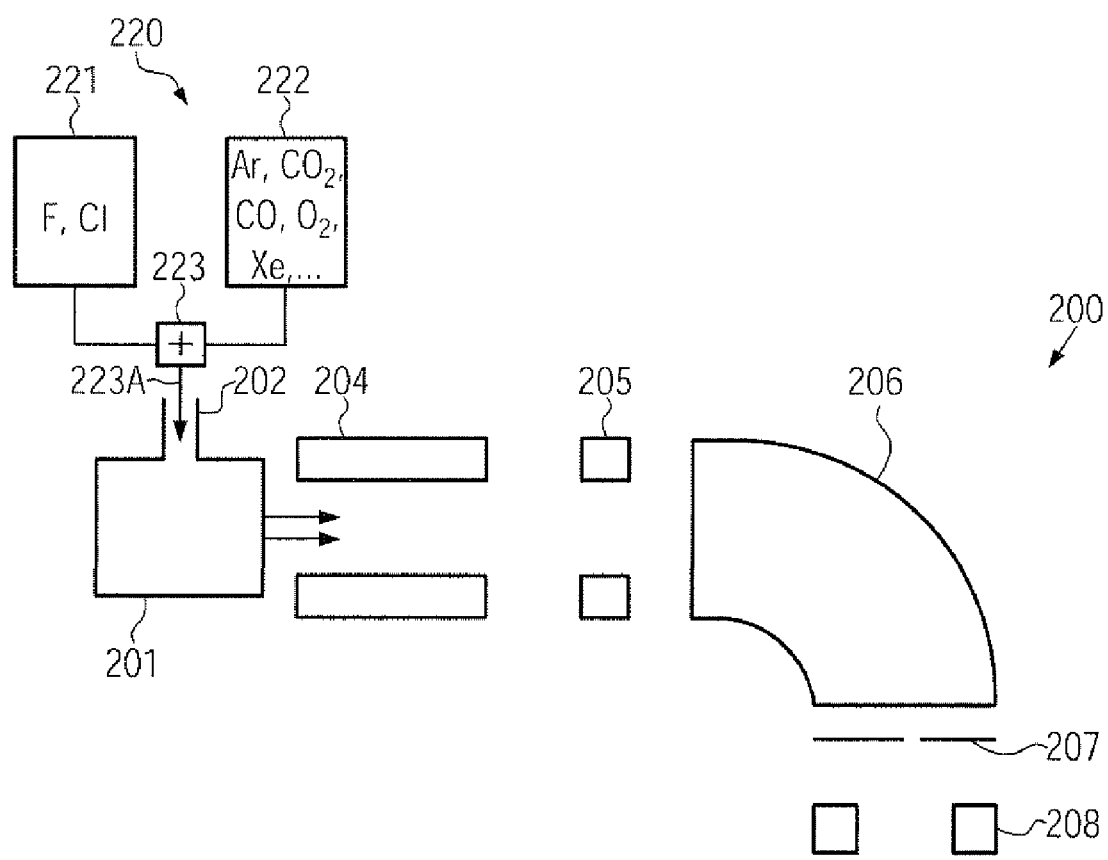
FIG. 2a schematically illustrates an implantation tool that may be operated on the basis of a specified halogen to non-halogen fraction so as to obtain a desired conditioning or cleaning effect, according to illustrative embodiments.
Figure 2A:
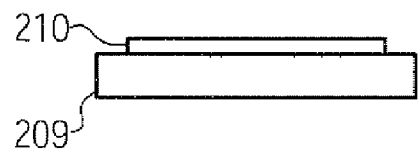

FIG. 2a schematically illustrates an implantation tool 200 comprising an ion source 201, an accelerator 204, a beam shaping magnet 205, a deflection magnet 206, an analyzing slit 207, a further beam shaping element 208 and a substrate holder 209. With respect to the components described so far, the same criteria apply as previously explained with reference to the implantation tool 100. Furthermore, an inlet 202 connected to the ion source 201 may be coupled to a source gas supply system 220, which may comprise a plurality of gas supply components 221, 222 and a gas mixture unit 223. In the embodiment shown, the gas supply 221 may be configured to provide a gas component comprising a halogen species, such as fluorine, chlorine and the like, while the gas supply 222 may be configured to provide gas components suitable for diluting a halogen-containing gas, wherein, in one embodiment, the supply 222 may provide a gas component that is substantially free of a halogen species. That is, in the context of the present disclosure, a substantially halogen-free gas component is to be understood as a gas whose stoichiometric formula does not include a halogen species, while it should be appreciated that traces of a corresponding halogen species may, nevertheless, be included due to any imperfections of the gas supply 222. For instance, argon, carbon dioxide, carbon monoxide, oxygen, xenon and the like are to be considered as substantially halogen-free gas components.

Similarly, the gas supply 221 may comprise a gas component including a halogen species, which is to be understood as a gas having a stoichiometric formula in which at least one halogen atom is indicated. For example, boron fluoride ($BF_3$), carbon fluoride ($CF_4$), antimony chloride ($SbCl_5$), indium chloride ($InCl_3$), silicon fluoride ($SiF_4$), germanium fluoride ($GeF_4$) and the like are considered as gas components including a halogen species. The gas supplies 221, 222 may be connected to the gas mixture unit 223, which in turn may be configured to provide a source gas 223A having a desired halogen fraction that is below a critical threshold ratio, which, according to illustrative aspects disclosed herein, may be selected to be 2:1 or less (halogen to non-halogen species) in the source gas 223A. In other cases, the contents of any halogen species contained in the source gas 223A may be restricted to approximately 66 atomic percent or less of the total composition of the source gas 223A.

For this purpose, the gas mixture unit 223 may comprise appropriate means, such as flow meters, gas detectors and the like, which are well established in the art, to enable the control of the halogen fraction of the source gas 223A. It should be appreciated that the source gas supply system 220 may comprise further gas supplies (not shown), which may be configured to provide other gas components, such as phosphorous hydride ($PH_3$), arsenic hydrogen ($AsH_3$) and the like, which may represent typical conventional source gases for doped semiconductor devices. Hence, these gases may be supplied to the ion source 201 via the mixture unit 223 with or without additional components of one of the gas components 221, 222. That is, in this case, the implantation tool 200 may be operated on the basis of respective "conventional" source gases, wherein, at least in some operational phases of the tool 200, the source gas mixture unit 223 may provide a desired fraction of halogen species in order to obtain the conditioning or cleaning effect. In other cases, fluorine or chlorine containing gases may be supplied to the unit 223 without being "diluted" when operation of the tool 200 may be deemed appropriate for a certain time period on the basis of conventional process conditions without providing the cleaning effect.

During the operation of the implantation tool 200, a substrate 210 may be loaded on the substrate holder 209, wherein the substrate 210 may represent a carrier material having formed thereon one or more microstructure devices, such as integrated circuits, at any intermediate manufacturing stage, in which the introduction of an implant species may be required, for instance with respect to doping specific semiconductor regions, modifying the molecular structure of device regions and the like. As previously explained, in some illustrative embodiments, the operational mode of the implantation tool 200 may be selected as a mode of "maximum utilization" so as to obtain a high throughput of products as is compatible with the capacity of the tool 200 and respective transport mechanisms (not shown) for exchanging substrates 210 with a respective manufacturing environment. Furthermore, in some illustrative embodiments, the implantation tool 200 may be substantially exclusively operated on the basis of an appropriate halogen fraction in order to "permanently" condition the beam line 204 and other components, such as the ion source 201, with respect to unwanted deposition of materials, such as tungsten and the like. In other illustrative embodiments, the implantation tool 200 may at least be temporarily operated in a respective "in situ" cleaning mode, in which an appropriate halogen fraction may be provided in the source gas 223A.

In the following description, it may be assumed that a respective in situ cleaning mode is to be performed. Hence, for a required implantation species to be introduced into certain portions of the substrate 210, such as P-type dopants, N-type dopants, inert species such as xenon, argon and the like, or any other components, an appropriate "basic" gas component may be provided to the mixture unit 223 and may be prepared therein so as to obtain the desired halogen concentration. For example, gas components such as boron fluoride ($BF_3$), carbon fluoride ($CF_4$), antimony chloride ($SbCl_5$), indium chloride ($InCl_3$) and the like may frequently be used in a plurality of semiconductor manufacturing flows, wherein the gas components may per se include a fraction of halogen species that may be greater than 2:1, thereby contributing to enhanced contamination of the beam line 204 and other related components of the implantation tool 200, as previously described. For example, when boron ions or boron fluoride ions ($BF_2^+$) may have to be introduced into the substrate 210, $BF_3$ may be supplied by the unit 221 to the mixture unit 223, wherein the (atomic) ratio of halogen, i.e., fluorine, to non-halogen, i.e., boron, is 3:1, which causes undesired contamination of the tool 200. Consequently, the gas supply 222 may be activated to supply any appropriate gas component for reducing the ratio to obtain an appropriate operating ratio as may be required for the in situ cleaning mode. For this purpose, even halogen-containing gas components may be supplied by the unit 222, as long as in total the overall atomic ratio may be maintained at a level of approximately 2:1 or less, or at approximately 66 atomic percent or less.

In some illustrative embodiments, the "dilution" of the halogen-containing gas supplied by the unit 221 may be accomplished on the basis of substantially halogen-free gas components, such as argon, carbon oxide, oxygen, xenon and the like, wherein the term "substantially halogen-free gas component" is to be understood in the above-defined sense. For example, by providing the gas components by the supply 221, 222 with a controlled value of mols per time unit, or controlled values of standard cubic centimeter per minute (sccm), the fraction of the halogen species, for instance of fluorine of $BF_3$, may be efficiently adjusted to an appropriate value to achieve the desired cleaning effect. For example, by supplying argon and $BF_3$ with substantially identical flow rates, the ratio of fluorine to non-fluorine species may be maintained at approximately 3:2 which may thus result in the desired cleaning effect or at least in a significantly reduced contamination of components of the implantation tool 200.

Consequently, after supplying the source gas 223A having a halogen fraction in the above-specified range, a respective plasma ambient may be established in the ion source 201 and respective ion species may be accelerated into the beam line 204, in which a further acceleration or deceleration may occur, depending on the process requirements. Finally, after "filtering" the ion beam and passing it through the beam optics 205, 208, a desired beam of ion may be provided in conformity with the specified process recipe, i.e., a specific type of ions may have been selected which are provided with a specified implantation energy, wherein the implantation dose may be adjusted by the beam current and the exposure time. Thus, for a plurality of "conventional" source gases, as specified above, an appropriate reduction of the fraction of halogen species, such as fluorine and chlorine, may be accomplished on the basis of, for instance, argon, carbon oxide, which may be appropriately combined in the mixture unit 223, thereby providing the possibility of processing the substrates 210 and concurrently conditioning the implantation tool 200.

Figure 2B:
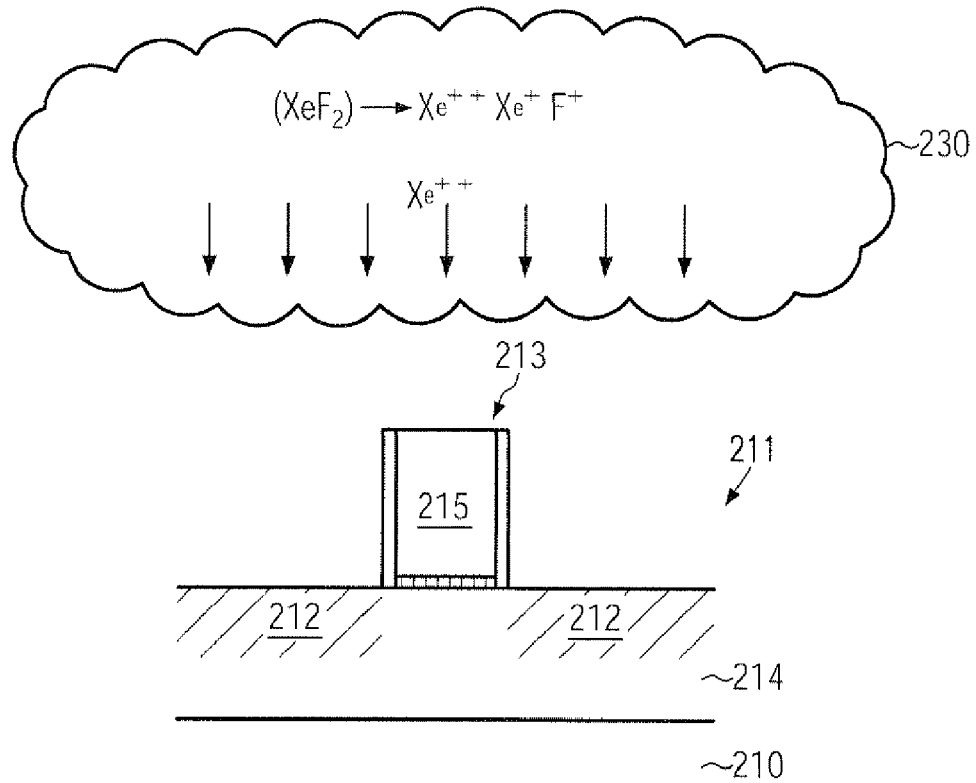
FIGS. 2b-2c schematically illustrate a cross-sectional view of a microstructure device, such as a semiconductor device, during implantation sequences, in which a cleaning or conditioning effect may be concurrently achieved, according to further illustrative embodiments.

FIG. 2b schematically illustrates a cross-sectional view of a microstructure device 211, which may be formed above the substrate 210. In one illustrative embodiment, the microstructure device 211 may represent a semiconductor device comprising a semiconductor region 214 in which, at least locally, a crystalline structure may be temporarily damaged or even be substantially completely destroyed so as to provide substantially amorphized portions 212. For example, the portions 212 may represent, at least partially, drain and source regions of a field effect transistor 213, which may comprise an implantation mask 215, such as a gate electrode structure and the like. Typically, the microstructure device 211 may be formed on the basis of a specified manufacturing sequence involving a large number of individual process steps, wherein, at certain points in the overall manufacturing flow, an implantation process may be required. For this purpose, an appropriate process recipe may have been established and may be made available at the implantation tool 200 when the substrate 210 is to be processed therein.

In the embodiment shown, an implantation process 230 may be designed such that the substantially amorphized portions 212 may be generated in the semiconductor region 214 on the basis of an inert species, which, in one illustrative embodiment, may be a xenon species, for instance in the form of a double ionized or single ionized species. In this case, the implantation tool 200 may be operated to perform the implantation process 230 according to specified parameters, for instance on the basis of a desired implantation energy, thereby substantially defining the penetration depth of the xenon species into the layer 214, which may thus substantially determine the depth of the substantially amorphized portions 212, as well as the implantation dose. During the implantation process 230, xenon fluoride ($XeF_2$) may be ionized in the ion source 201, as previously explained, wherein the fraction of fluorine species to non-fluorine species is 2:1, that is, approximately 66 atomic percent of the source gas is represented by a halogen species, thereby providing the desired conditioning effect in the implantation tool 200, as previously explained. Thus, upon appropriately setting the tool configuration, the Xe' or the Xe'' ion species may be selected and may be incorporated into the layer 214, thereby forming the substantially amorphized portions 212. For example, in sophisticated semiconductor devices, the amorphization of portions of the drain and source area, frequently referred to as pre-amorphization, may be advantageously used for cleaning the implantation tool, while concurrently performing a required process step in the tool. For instance, the ion bombardment with xenon ions may be used for enhancing the incorporation of actual dopants into the drain and source regions, the creation of strain therein by re-crystallizing the amorphized portions under specific conditions, modifying the molecular structure of materials and the like.

In other illustrative embodiments, the implantation process 230 may be designed to modify the material characteristics of the microstructure device 211, for example in relaxing an internal stress level of highly stressed dielectric materials, as may typically be used for strain engineering techniques in enhancing overall transistor performance in sophisticated devices. Also, in this case, a xenon ion species may be advantageously used while concurrently conditioning the implantation tool.

Figure 2C:
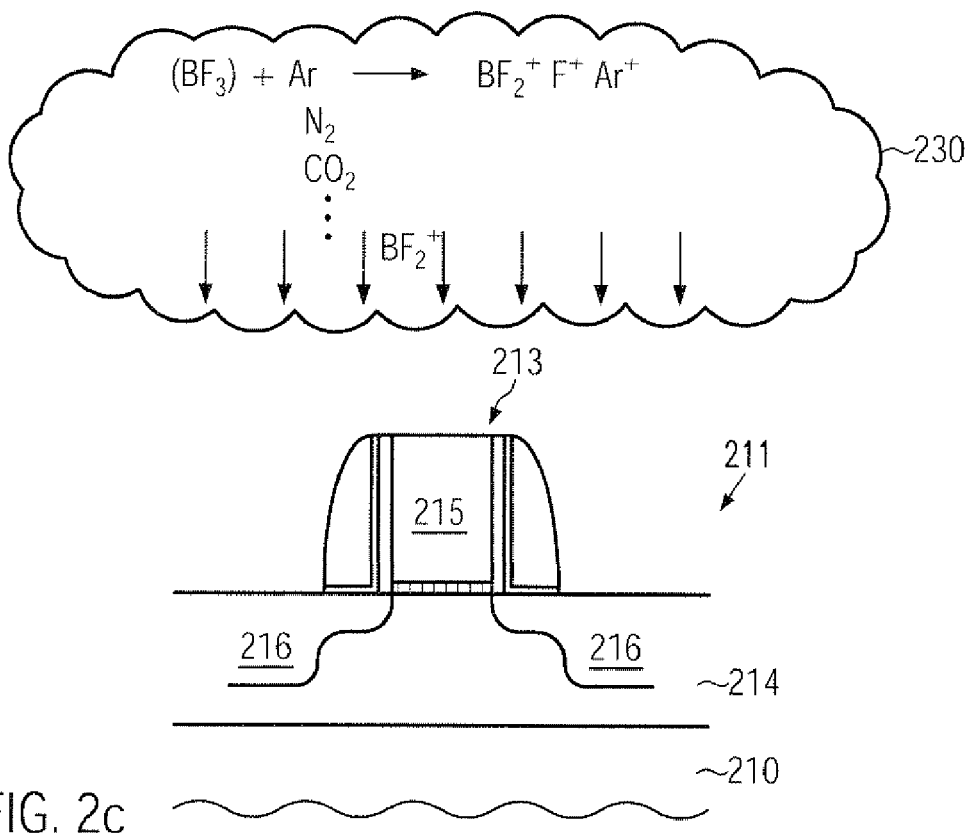

FIG. 2c schematically illustrates the substrate 210 during the implantation process 230 according to still further illustrative embodiments. As shown, the microstructure device 211 may comprise a transistor element 213 including a gate electrode structure 215, wherein drain and source regions 216 may be formed in the semiconductor region 214 during the implantation process 230, wherein the process may comprise a plurality of individual implantation steps, at least one of which may be performed on the basis of an appropriately prepared source gas 223A, as previously described. In the embodiment shown, the transistor 213 may represent a P-type transistor in which a boron species, for instance in the form of $B^+$ or $BF_2^+$, is to be introduced. In this case, the implantation process 230 may be performed on the basis of gas components $BF_3$ and argon, carbon oxide and the like, wherein these components may be supplied by the units 221, 222, as previously explained. During the generation of ions in an appropriately established plasma ambient in the ion source 201, the fraction of the fluorine species may be maintained at approximately 66 atomic percent and less, thereby providing the desired in situ conditioning or cleaning effect.

Similarly, if the incorporation of other species such as argon or fluorine may be required, carbon fluoride ($CF_4$) may be used in combination with one or more substantially halogen-free components which may be mixed to obtain a fraction of approximately 66 atomic percent fluorine with respect to the entire source gas composition. Similarly, by using antimony chloride ($SbCl_5$) in the implantation process 230, the reduced halogen contents may be accomplished by appropriately diluting this gas component until the total fraction of chlorine with respect to the entire gas composition may be approximately 66 atomic percent and less. For example, combining one mol of $SbCl_5$ with one mol nitrogen may result in a fraction of 5:3 of chlorine with respect to non-chlorine species, thereby providing a mixture that is appropriate for achieving the desired conditioning effect. Similarly, using indium chloride ($InCl_3$) in combination with a diluting component, such as argon, nitrogen, carbon dioxide and the like, an appropriate conditioning effect may be obtained by maintaining the chlorine fraction at approximately 66 atomic percent or less with respect to the entire source gas composition. For example, mixing one mol of $InCl_3$ with one mol of argon may result in an appropriate composition.

It should be appreciated that any other mixing ratio may be used as long as the operating ratio of halogen to non-halogen species is 2:1 or less or the fraction of halogen is approximately 66 atomic percent or less.

Figure 2D:
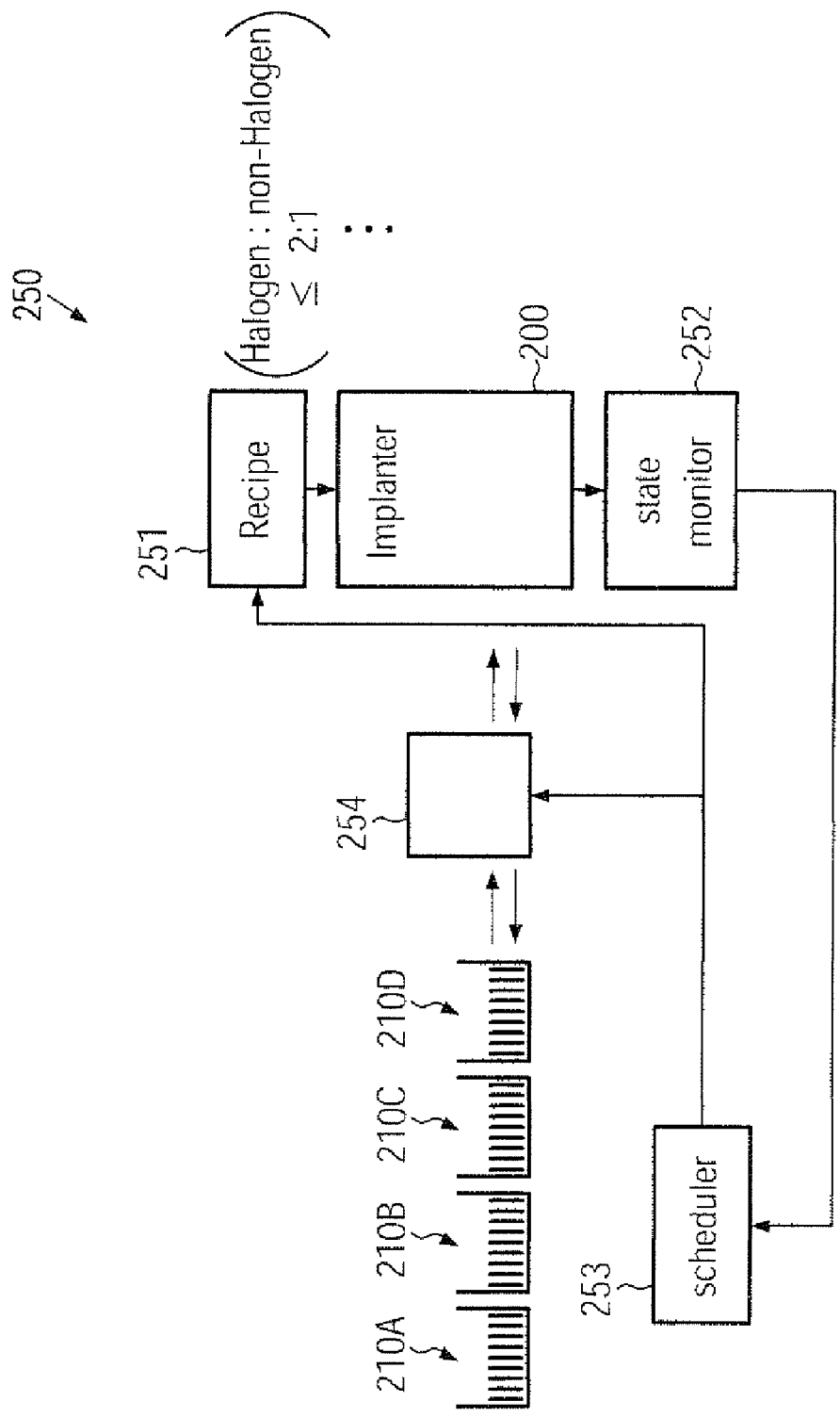
FIG. 2d schematically illustrates a manufacturing environment including an implantation tool, wherein a manufacturing flow of producing microstructure devices may be appropriately scheduled to provide a conditioning or cleaning effect of the implantation tool without interrupting the processing of products, according to still further illustrative embodiments.

FIG. 2d schematically illustrates a manufacturing environment 250 including the implantation tool 200, as previously described, wherein a plurality of substrates 210A, 210B, 210C, 210D are to be processed in the tool 200 in accordance with a respective manufacturing flow of each of the substrates 210A, 210B, 210C, 210D. That is, each of these substrates 210A, 210B, 210C, 210D may have a dedicated manufacturing sequence requiring the incorporation of an implant species at specific points of the overall manufacturing flow. In other cases, the substrates 210A, 210B, 210C, 210D may represent substrates of the same product type at different manufacturing stages so that different implantation recipes may have to be applied to the substrates 210A, 210B, 210C, 210D. Furthermore, the manufacturing environment 250 may further comprise a scheduler 253 which may represent an appropriate mechanism for supplying substrates to the implantation tool 200 by means of an appropriately designed transport mechanism 254. That is, the scheduler 253 may be configured to appropriately provide substrates 210A, 210B, 210C, 210D so as to comply with the overall management requirements of the manufacturing environment 250 and also to comply with a desired tool performance of the implantation tool 200, for instance with respect to overall throughput. Furthermore, the implantation tool 200 may be associated with appropriate process recipes 251, which may be appropriately invoked upon processing a certain type of substrate 210A, 210B, 210C, 210D. That is, at some stages of the overall manufacturing flow, the implantation of specific species, such as dopants and the like, may be required at specified implantation parameters, wherein the scheduler 253 may appropriately organize the supply of substrates to comply with the actually adjusted recipe in order to reduce the frequency of recipe changes. In other cases, an appropriate recipe 251 may be invoked upon arrival of a respective group of substrates 210A, 210B, 210C, 210D, depending on the overall process strategy. Additionally, in one illustrative embodiment, the environment 250 may comprise a state monitor 252, which may provide information with respect to the status of the implantation tool 200, for instance with respect to the cleaning status of the tool 200. That is, the state monitor may provide information where the conditioning of the implantation tool 200 may be required or not, wherein this information may be obtained, for instance, by detecting the current status of specific components of the implantation tool 200 and/or by providing external status information, for instance by indicating the requirement for a conditioning treatment on a regular basis and the like. In one illustrative embodiment, as shown in FIG. 2d, the state monitor 252 may be operatively combined with the scheduler 253 so as to appropriately schedule arrival of substrates 210A, 210B, 210C, 210D at the implantation tool 200, which may enable the processing of the substrates 210A, 210B, 210C, 210D on the basis of an in situ cleaning mode, as previously described.

That is, in some circumstances, it may not be desirable to operate the implantation tool 200 on the basis of an in situ cleaning mode in a permanent manner but a respective mode may be invoked to provide a desired operational behavior of the implantation tool 200. In this case, after receiving a respective indicator by the state monitor 252, the scheduler 253 may select appropriate substrates which may therefore be transferred to the implantation tool 200 at increased priority in order to perform an in situ conditioning implantation process. For example, if at least some of the substrates 210A, 210B, 210C, 210D may require an amorphization implantation or any other treatment on the basis of a xenon species, the in situ cleaning effect associated therewith may be advantageously used for conditioning the tool 200 at any appropriate stage by prioritizing these substrates, when requirement for conditioning is indicated. Similarly, any other in situ cleaning implantation modes may be invoked, for instance after operating the implantation tool 200 in a substantially "conventional" mode, thereby conditioning the tool 200 substantially without interrupting overall manufacturing flow, which may therefore contribute to reduced cycle times and production costs.

As a result, the present disclosure relates to an in situ cleaning mode for operating implantation tools during a manufacturing sequence for fabricating microstructure devices, such as integrated circuits, by using an appropriate mixture of halogen species and non-halogen species in the source gas of the implantation tool, while actually processing products. For this purpose, the fraction of a halogen species may be maintained at approximately 66 atomic percent or less with respect to the entire composition of the source gas, thereby providing the desired conditioning effect. This may be accomplished by appropriately "diluting" halogen-containing gas components if the initial fraction of halogen species is too high. On the other hand, implantation source gases that may initially not comprise a sufficient amount of halogen may be mixed with a halogen-containing gas component to provide the appropriate composition of the source gas. As a consequence, preventive maintenance of implantation tools may be reduced, thereby increasing overall throughput of the implantation tool when operated, at least temporarily, in an in situ cleaning mode.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a microstructure product, the method comprising:
   creating ions from a source gas in a plasma ambient, said source gas comprising a halogen species, wherein an operating ratio of said halogen species to non-halogen species of said source gas is 2:1 or less;
   preparing said source gas for creating said ions by supplying a first gas component including said halogen species and adjusting said operating ratio by supplying a second gas component comprised of non-halogen species, wherein said second gas component comprises carbon oxide;
   accelerating said ions into a beam line; and
   implanting at least a fraction of said ions into a material formed above or in a substrate comprising said microstructure product in an intermediate manufacturing stage.

2. The method of claim 1, wherein implanting said at least a fraction of said ions comprises selecting an energy and a dose of said at least a fraction of said ions to cause an amorphizing effect in said material.

3. The method of claim 2, wherein said source gas comprises xenon fluorine ($XeF_2$) and said at least a fraction of said ions comprises xenon ions.

4. The method of claim 1, wherein said first gas component comprises boron fluoride ($BF_3$).

5. The method of claim 1, wherein said first gas component comprises carbon tetra fluoride (CE).

6. The method of claim 1, wherein said first gas component comprises antimony penta chloride ($SbCl_5$).

7. The method of claim 1, wherein said first gas component comprises indium chloride ($InCl_3$).

8. The method of claim 1, wherein said microstructure product represents an integrated circuit.

9. A method of conditioning an implantation tool, the method comprising:
   providing a source gas comprised of xenon fluoride ($XeF_2$) having a fraction of fluorine species of approximately 66 atomic percent relative to a total composition of said source gas; and
   operating said implantation tool using said source gas.

10. The method of claim 9, wherein operating said implantation tool comprises implanting an ion species into a substrate having formed thereon a microstructure device in an intermediate manufacturing stage.

11. The method of claim 10, wherein implanting said ion species comprises forming a substantially amorphized portion in a semiconductor region of said microstructure device.

12. The method of claim 11, wherein said substantially amorphized portion corresponds at least partially to a drain and source area of a field effect transistor of said microstructure device.

13. The method of claim 11, wherein said ion species is a xenon species.

14. The method of claim 10, wherein implanting said ion species comprises introducing a dopant species for forming transistor active regions in said microstructure device.

15. A method of processing substrates comprising microstructure devices, the method comprising:
   determining a cleaning status of an implantation tool used for performing at least one implantation process of a manufacturing flow for manufacturing said microstructure devices; and
   at least when said cleaning status indicates that a cleaning is required, processing at least some substrates in said implantation tool on the basis of a source gas including a halogen.

16. The method of claim 15, wherein a ratio of halogen species to non-halogen species of said source gas is approximately 2:1 or less.

17. The method of claim 16, wherein said source gas comprises at least one of xenon fluoride ($XeF_2$), boron fluoride ($BF_3$), carbon tetra fluoride ($CF_4$), antimony penta chloride ($SbCl_5$) and indium chloride ($InCl_3$).

18. The method of claim 17, further comprising adjusting said ratio by adding at least one of argon (Ar), nitrogen ($N_2$) and carbon oxide ($CO_2$) to said source gas.

19. The method of claim 15, wherein processing at least some of said substrates comprises performing an amorphization process on crystalline regions of said microstructure products.

20. The method of claim 19, wherein processing at least some of said substrates comprises forming drain and source regions of field effect transistors.

21. The method of claim 15, further comprising performing an ion implantation process on additional substrates using said implantation tool.

* * * * *